United States Patent [19]
Mori

[11] Patent Number: 6,107,106
[45] Date of Patent: *Aug. 22, 2000

[54] LOCALIZED CONTROL OF INTEGRATED CIRCUIT PARAMETERS USING FOCUS ION BEAM IRRADIATION

[75] Inventor: Kiyoshi Mori, San Antonio, Tex.

[73] Assignees: Sony Corporation, Tokyo, Japan; Sony Electronics, Inc., Park Risge, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 09/019,296

[22] Filed: Feb. 5, 1998

[51] Int. Cl.[7] .......................... H01L 21/66; H01L 21/265; G21K 5/00
[52] U.S. Cl. .......................... 438/10; 250/492.1; 324/501; 324/765; 43/12; 43/17; 43/18; 43/798
[58] Field of Search ................................. 438/10, 17, 798, 438/5, 11–14, 18; 250/492.2, 492.21–492.24; 29/407.05; 324/765–769, 751, 501, 522, 523, 524

[56] References Cited

U.S. PATENT DOCUMENTS

| | | | |
|---|---|---|---|
| 3,272,661 | 9/1966 | Tomono et al. | 438/798 X |
| 3,330,696 | 7/1967 | Ullery, Jr. et al. | 438/13 X |
| 3,674,995 | 7/1972 | Kendall | 438/10 X |
| 3,933,527 | 1/1976 | Tarneja et al. | 438/10 |
| 4,013,483 | 3/1977 | Nuzillat et al. | 438/11 |
| 4,075,037 | 2/1978 | Tarneja et al. | 438/10 |
| 4,172,741 | 10/1979 | Johnson | 438/10 |
| 4,392,893 | 7/1983 | Du et al. | 438/10 X |
| 4,701,422 | 10/1987 | Elliott | 438/10 X |
| 5,650,335 | 7/1997 | Terazono | 438/11 |
| 5,920,765 | 7/1999 | Naum et al. | 438/17 X |

FOREIGN PATENT DOCUMENTS 4-116982  4/1992  Japan .

OTHER PUBLICATIONS

Effects of Focused Ion Beam Irradiation on MOS Transistors—Ann Campbell et al., Sandia National Labs; pp. 72, 74, 76, 78 and 80. Jul. 1997 IEEE.

SII Seiko Instruments SMI9800SE; Defect Inspection, Review, and Analysis System; Metron Technology 5 pages by Jul. 1998.

FEI; DualBeam 820, FIB/SEM Workstation for Process Characterization and Yield Enhancement; Jun. 1995 pp. 1–12.

*Primary Examiner*—Thomas P. Noland
*Attorney, Agent, or Firm*—Rader, Fishmand & Grauer; Ronald P. Kananen

[57] ABSTRACT

A method of localized control of integrated circuit parameters according to the present invention is used to adjust a the threshold voltage of an integrated circuit by irradiating an inoperable area with a focused ion beam such that the determination of the correct threshold voltage is facilitated without having to refabricate the integrated circuit in its entirety.

9 Claims, 2 Drawing Sheets

LOCALIZED CONTROL OF INTEGRATED CIRCUIT PARAMETERS USING FOCUS ION BEAM IRRADIATION

FIELD OF INVENTION

The present invention relates to manufacture of integrated circuits. In particular, the present invention is directed towards localized parameter control of integrated circuits using focused ion beam irradiation.

BACKGROUND OF THE INVENTION

One of the most widely used electronic devices especially in digital integrated circuits ("ICs") is the metal-oxide semiconductor ("MOS") transistors. MOS transistors are characteristic in that the gate electrode of a MOS transistor is a metal such as aluminum (Al) and the electrode is isolated from the channel by an insulator such as silicon oxide ($SiO_2$). One of the most important parameters associated with MOS type transistor is the threshold voltage ("$V_T$"). $V_T$ is the voltage needed to turn on the transistor. That is to say, $V_T$ is the minimum voltage at which electrons begin to move from the source of the transistor to the drain, allowing the transistor to conduct electricity.

The current process by which ICs are developed and produced by manufacturers is shown in the flow diagram of FIG. 1. As shown, an IC is initially designed in step 10 with expected $V_T$ values obtained during the design stage of the device. Then in steps 12–16, $V_T$ adjustment processing is performed on a wafer using various known methods such as photoresist patterning, ion implantation, and heat treatment to set the $V_T$ obtained during the initial design of the device. Typically, steps 12–16 can take anywhere from one to three months to complete because of the time consuming processes involved in creating the wafer, the mask, and the adjusting procedure.

Once the $V_T$ adjusting process is complete, a diagnostic test is performed in step 18 to determine whether the operating parameters of the processed wafer meet specified requirements. Specifically, testing is performed on each area of the processed wafer to determine if the $V_T$ values initially obtained during the design stage work on actually fabricated ICs. If the test fails on any part of the wafer, new values of $V_T$ are calculated as shown in step 20 for the failed areas. Consequently, new $V_T$ adjustment masks are designed and produced as shown in step 22, and the whole process begins again using the new mask with a new wafer. Each time a $V_T$ adjustment has to be made, the entire process as shown in FIG. 1 must be repeated until the processed wafer passes the test at which point the successful processing parameters are used to mass produce the designed device.

As one can imagine, this process of adjusting $V_T$ is long, tedious, and very costly since each run must start with a new wafer and the run takes anywhere from one to three months to complete. Hence, a simpler, faster, and less expensive method is needed in adjusting $V_T$ values of an IC device.

SUMMARY OF THE INVENTION

The present invention is directed to a faster, more efficient, and less expensive method of adjusting parameters of an IC. More specifically, the present invention is a method of localized control of IC parameters, such as $V_T$ by using focused ion beam irradiation ("FIB").

Because of its ability to create resolution images, FIB technology is being used in the semiconductor arts as a developmental tool in obtaining precision views and cross-sectional views of semiconductor wafers for the purposes of physical defect detection. However, a side affect of using FIB irradiation for obtaining such an image is that the process changes the threshold voltage of the exposed area on the wafer. Hence, FIB scanners are used as destructive inspection tools for defect analysis in semiconductor technology.

Ironically, this same side affect is harnessed according to the present invention to overcome the shortcomings of the prior art system as described above. Therefore, a method of localized control of integrated circuit parameters according to the present invention includes the steps of:

(a) designing an integrated circuit with expected circuit parameters;

(b) processing the integrated circuit designed in step (a);

(c) performing a diagnostic test on the processed integrated circuit of step (b);

(d) if the diagnostic test fails, determining a new value of the circuit parameter;

(e) adjusting the circuit parameter by irradiating an area of the integrated circuit that failed step (d) with focused ion beam; and (f) repeating steps (c)–(d) until the integrated circuit passes the diagnostic test.

In particular, the controlled parameter is the threshold voltage of the integrated circuit.

One advantage of the present invention is that the wafer processing procedure does not have to be repeated every time $V_T$ is adjusted. Instead, FIB irradiation is used to adjust the value of $V_T$ in the failed areas of the processed wafer until the correct $V_T$ has been set. Then, this $V_T$ value is used in the mass production stage, reducing research and development time from one to three months typical of the prior art system to just a few hours using the method of the present invention.

Another advantage of the present invention is that the parameters of non-critical IC devices, such as those used in toys or disposable equipment, can be adjusted using the method of the present invention and put directly to use without having to be refabricated using new wafers. This, in turn, reduces processing cost as well as manufacturing time, allowing vendors to pass the savings on to the consumers.

BRIEF DESCRIPTION OF DRAWINGS

The features and inventive aspects of the present invention will become more apparent upon reading the following detailed description, claims, and drawings, of which the following is a brief description:

DETAILED DESCRIPTION OF THE INVENTION

Figure 2:
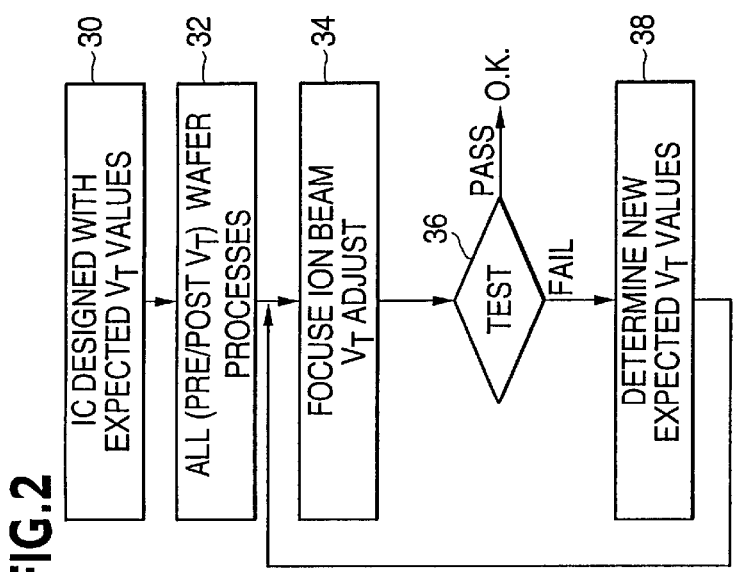
FIG. 2 is a flow diagram describing a method of $V_T$ adjustment according to the present invention.
Figure 1:
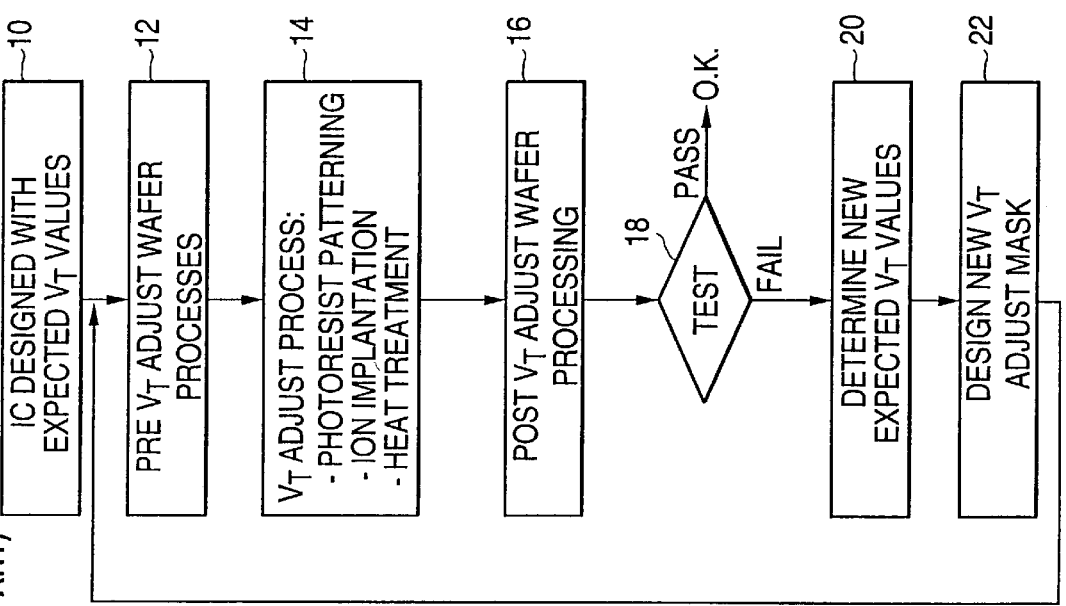
FIG. 1 is a flow diagram describing a method of $V_T$ adjustment used in the prior art.

FIG. 2 shows a flow diagram describing the method of localized control of IC parameters such as threshold voltage using FIB irradiation according to the present invention. As shown in step 30, an IC is designed with expected $V_T$ values. Then, in step 32, a semiconductor wafer is processed according to the initial design obtained in step 30. When a new wafer has been processed, step 34 is skipped the first time through and the method goes directly to step 36. In step 36, the processed wafer is tested to confirm that each critical area of the wafer is operational. If the wafer passes the test, then the device is sent to be mass produced. However, if the wafer fails the diagnostic test of step 36, a new value for $V_T$ is determined in step 38 and sent to step 34.

In step 34, the new value of $V_T$ is then used to apply a focused ion beam on the failed area of the wafer with the correct amount of dosage to adjust the exposed area according to the newly determined $V_T$ value. The wafer, then, is tested again to determine operability. This process of applying FIB irradiation, testing the wafer, and determining a new $V_T$ value is repeated until the processed wafer passes the diagnostic test. The obtained $V_T$ values are then used to create a mask for mass production of the device.

Figure 3:
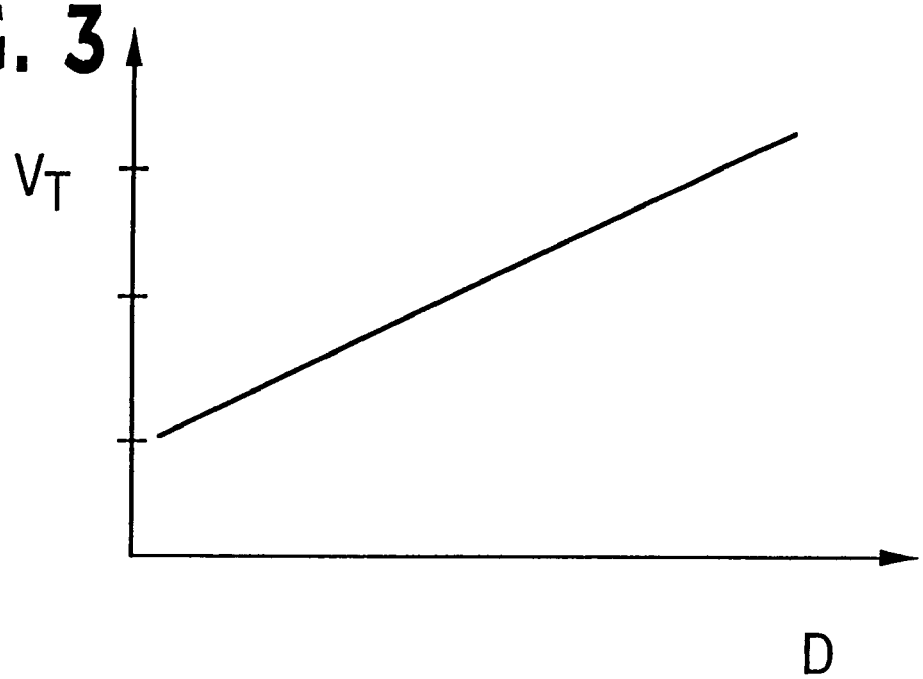
FIG. 3 is a graph describing the threshold voltage in relation to the dosage of FIB irradiation.

The method of the present invention takes advantage of the fact that threshold voltage $V_T$ is affected by exposure to FIB in a predictable manner. As shown in FIG. 3, threshold voltage ($V_T$) is affected by the dosage (D) of FIB irradiated in a certain area of a semiconductor wafer. The equation describing the relationship between $V_T$ and D is well known in the art. Preferably, the data describing the relationship between $V_T$ and D is obtained empirically for each piece of FIB equipment and stored in memory of the FIB controller. Furthermore, the dosage (D) is characterized by the equation:

$$D = \frac{I \cdot t}{A}$$

where
- I: FIB beam current
- t: FIB irradiation time
- A: FIB irradiation area.

Consequently, each of the variables I, t, and A may be customized for a particular wafer and used in conjunction with the $V_T$–D data obtained empirically to determine the dosage level needed to obtain a certain value of $V_T$.

Figure 4:
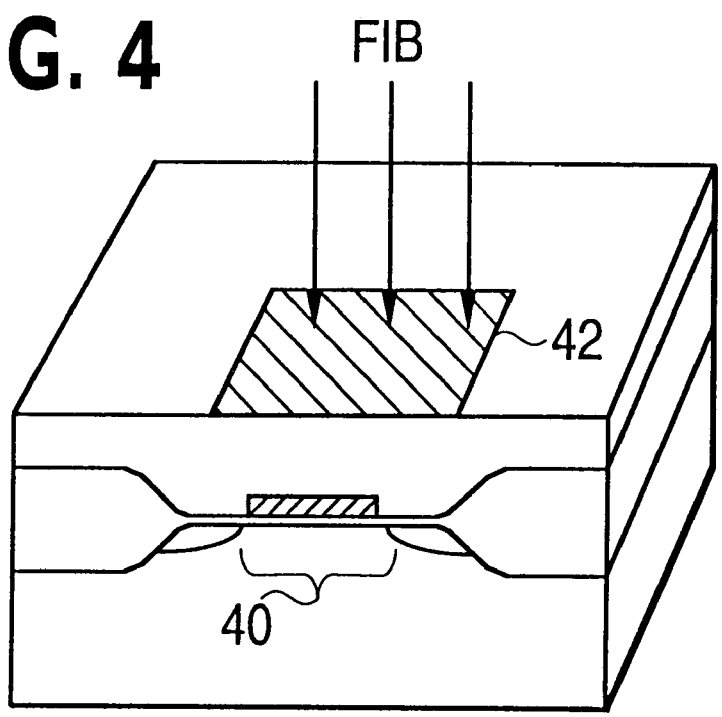
FIG. 4 is a cross-sectional view of a semiconductor device irradiated with FIB.

As an example, FIG. 4 shows a cross-section of a device on a processed wafer, e.g., a MOS transistor 40. When transistor 40 fails the test in step 36, i.e., the supplied $V_T$ is not operable, a new $V_T$ value is calculated, and the new $V_T$ value is then used to determine the dosage of the FIB using empirical data already collected for the FIB equipment. Then, using the dosage equation above, a duration of the exposure time is determined since the current of the FIB beam and the FIB scan area 42 is known. In this way, a new wafer does not have to be processed just to determine the $V_T$ of the inoperable transistor. Once the new value of $V_T$ is determined and the operability of the wafer verified, a production mask is developed and created based on the verified working parameters to be used in mass producing the wafer. Accordingly, the method of the present invention saves valuable time and cost associated with determining the correct working parameters of prototype wafer design.

Alternatively, the method of the present invention may also be used to adjust wafers to be used directly in an application. Inoperable wafers due to incorrect $V_T$ values may be fixed by using the method of the present invention as described above thereby reducing the amount of wafers normally thrown away. Having fully described the preferred embodiments of the invention, variations and modifications may be employed without departing from the scope of the present invention. Accordingly, the following claims should be studied to learn the true scope of the present invention.

What is claimed is:

1. A method of generating a production mask for mass production of semiconductor devices including transistors, the method comprising:

(a) designing an integrated circuit including MOS transistors with expected circuit parameters including a threshold voltage parameter for said transistors;

(b) preparing the integrated circuit designed in said designing step;

(c) performing a diagnostic test on the integrated circuit to determine an actual threshold voltage for one or more of said transistors;

(d) comparing said actual threshold voltage with an expected threshold voltage from said step of designing said integrated circuit;

(e) if said actual threshold voltage differs from said expected threshold voltage, adjusting said actual threshold voltage by irradiating selected portions of said integrated circuit with focused ion beam; and (f) when said actual threshold voltage is corrected in accordance with said expected threshold voltage from said step of designing said integrated circuit, preparing a mask for said integrated circuit according to a design of said integrated circuit generated in said step of designing said integrated circuit and according to said adjustment made to said integrated circuit with said focused ion beam.

2. The method of claim 1, further comprising mass producing integrated circuits using said mask.

3. The method of claim 1, further comprising repeating said steps of performing a diagnostic test, comparing said actual threshold voltage to said expected threshold voltage and adjusting said actual threshold voltage using a focused ion beam until said actual threshold voltage matches said expected threshold voltage.

4. The method of claim 1, further comprising:

determining a relationship between change in actual threshold voltage and dosage of said focused ion beam irradiation for a particular ion beam irradiation device; and using said relationship to control said step of irradiating selected portions of said integrated circuit with said focused ion beam.

5. The method of claim 4, wherein said determining a relationship for said particular ion beam irradiation device is performed using empirical data from previous operation of said ion beam irradiation device.

6. A device for generating a production mask for mass production of semiconductor devices including transistors, the device comprising:

(a) means for preparing an integrated circuit according to a predetermined design, wherein said integrated circuit includes MOS transistors with expected circuit parameters including a threshold voltage parameter for said transistors;

(b) means for performing a diagnostic test on the integrated circuit to determine an actual threshold voltage for one or more of said transistors;

(c) means for comparing said actual threshold voltage with an expected threshold voltage determined according to said design for said integrated circuit;

(d) means for adjusting said actual threshold voltage by irradiating selected portions of said integrated circuit with focused ion beam if said actual threshold voltage differs from said expected threshold voltage; and (e) after said actual threshold voltage is corrected in accordance with said expected threshold voltage, means for preparing a mask for said integrated circuit according to said design of said integrated circuit and according to said adjustment made to said integrated circuit with said focused ion beam.

7. The device of claim 6, further comprising means for mass producing integrated circuits using said mask.

8. The device of claim 6, further comprising:

means for determining a relationship between change in actual threshold voltage and dosage of said focused ion beam irradiation for a particular ion beam irradiation device; and means for using said relationship to control said step of irradiating selected portions of said integrated circuit with said focused ion beam.

9. The device of claim 8, further comprising means for gathering empirical data from previous operation of said ion beam irradiation device for use in determining said relationship.

* * * * *